(12) United States Patent
Honda

(10) Patent No.: US 8,440,572 B2
(45) Date of Patent: May 14, 2013

(54) SI ETCHING METHOD

(75) Inventor: Masanobu Honda, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 521 days.

(21) Appl. No.: 12/576,536

(22) Filed: Oct. 9, 2009

(65) Prior Publication Data

US 2010/0093178 A1  Apr. 15, 2010

(30) Foreign Application Priority Data

Oct. 15, 2008  (JP) .................................. 2008-266231

(51) Int. Cl.
*H01L 21/306* (2006.01)

(52) U.S. Cl.
USPC ......................................... 438/719; 252/79.1

(58) Field of Classification Search ........................ None
See application file for complete search history.

(56) References Cited

U.S. PATENT DOCUMENTS

| 4,450,042 | A | 5/1984 | Purdes |
| 5,578,133 | A * | 11/1996 | Sugino et al. ..................... 134/2 |
| 6,583,065 | B1 * | 6/2003 | Williams et al. .............. 438/714 |
| 7,115,476 | B1 | 10/2006 | Izumida |
| 2002/0070380 | A1 * | 6/2002 | Andoh .............................. 257/46 |
| 2003/0173333 | A1 * | 9/2003 | Wang et al. ...................... 216/67 |
| 2004/0171254 | A1 | 9/2004 | Iijima et al. |
| 2005/0103748 | A1 * | 5/2005 | Yamaguchi et al. ............. 216/67 |
| 2009/0068845 | A1 * | 3/2009 | O'Donnell ..................... 438/723 |

FOREIGN PATENT DOCUMENTS

| JP | 3-241829 | A | 10/1991 |
| JP | 5-94898 | | 4/1993 |
| JP | 5-217956 | A | 8/1993 |
| JP | 6-21000 | A | 1/1994 |
| JP | 2000-100798 | | 4/2000 |
| JP | 2003-218093 | | 7/2003 |
| JP | 2003-218093 | A | 7/2003 |
| JP | 2006-310651 | A | 11/2006 |

OTHER PUBLICATIONS

Chiu et al, Surface cleaning of GaAs by in situ chemical beam etching, Dec. 1994, Applied Physics Letters, p. 3368-3370.*

* cited by examiner

*Primary Examiner* — Binh X Tran
*Assistant Examiner* — David Cathey, Jr.
(74) *Attorney, Agent, or Firm* — Rothwell, Figg, Ernst & Manbeck, P.C.

(57) ABSTRACT

A Si etching method includes: arranging a silicon substrate or a substrate having a silicon layer in a processing chamber; generating a plasma of an etching gas in the processing chamber; and etching the silicon substrate by the plasma. The etching gas is a gaseous mixture including a $Br_2$ gas and one of a $Cl_2$ gas and a chloride gas. The chloride gas has a mass that is higher than that of the $Cl_2$ gas.

10 Claims, 8 Drawing Sheets

FIG. 4

| | TEST EXAMPLE 1 | TEST EXAMPLE 2 | TEST EXAMPLE 3 |
|---|---|---|---|
| SEM PHOTO | Cl₂ = 100sccm, HBr = 0sccm | Cl₂ = 50sccm, HBr = 50sccm | Cl₂ = 0sccm, HBr = 100sccm |
| Si E/R | 319 nm/min | 221 nm/min | 151 nm/min |
| SiN E/R | 80 nm/min | 61 nm/min | 49 nm/min |
| SELECTIVITY | 4.0 | 3.6 | 3.1 |
| BOWING△CD (L1- L2) | 14 nm | 4 nm | TAPER SHAPE |

SI ETCHING METHOD

CROSS-REFERENCE TO RELATED APPLICATIONS

This application claims priority to Japanese Patent Application No. 2008-266231 filed on Oct. 15, 2008, the entire contents of which are incorporated herein by reference.

FIELD OF THE INVENTION

The present invention relates to a method of etching silicon (Si); and more particularly, to a dry etching method using a plasma.

BACKGROUND OF THE INVENTION

An Si etching is mainly carried out for trench formation in silicon, e.g., groove-shaped trenches for device isolation and hole-shaped trenches for capacitor formation, and for electrode formation in polycrystalline silicon, e.g., a gate electrode of a metal oxide semiconductor field effect transistor (MOSFET).

In Si trench etching, it is important to control the depth to width ratio (i.e., aspect ratio) and a vertical cross sectional shape of the trench; and especially it is an important issue to prevent bowing etching, in which is the trench has a barrel shape, taper etching, in which a groove gets narrower from top to bottom, and undercut etching below a mask (side etching) and the like. Further, to improve the dimensional accuracy in etching pattern, it is important that a ratio of etching rate of the silicon substrate to that of the etching mask, i.e., mask or etching selectivity or simply selectivity, is sufficiently high.

In polycrystalline silicon etching, the important factor is the high dimensional accuracy of a gate electrode by which the characteristics of the MOSFET are affected. Moreover, a high selectivity is required for a gate oxide film ($SiO_2$).

To solve such technical issue, the etching gas employs a halogen compound gas including hydrogen, such as hydrogen bromide (HBr), or a gaseous mixture in which $CHF_3$ or the like is added to a halogen gas such as $Cl_2$. As for an etching apparatus, a reactive ion etching (RIE) apparatus is employed, which gives the directivity to ions in the plasma and allows the ions to react with a target object (silicon substrate) (see, e.g., the Japanese Patent Laid-open Application No. 2003-218093).

With ever-increasing demands for high-integration and high-performance of the semiconductor devices manufactured on the silicon substrate, semiconductor elements constituting the devices are made smaller by a scaling rule of about 0.7-times. Therefore, 65 nm and 45 nm design rule (i.e. design standard), which are currently applied to the state-of-the-art semiconductor products, are expected to become about 32 nm in the next-generation products and about 22 nm in the next-next generation products.

If the device design standard approaches to 22 nm in the next-next generation products, the MOSFET (or a metal insulator semiconductor field effect transistor (MOSFET)), which is a basic semiconductor device for the large scale integration (LSI) circuits, is highly likely to be changed from a two-dimensional structure (planar structure), in which its channel, source and drain regions are two-dimensionally formed on a main surface of a silicon substrate, to a three-dimensional structure (stereoscopic structure), in which such regions are three-dimensionally formed on the main surface of the silicon substrate.

In the three-dimensional structure, the channel region is formed on a sidewall of a fin or a pillar, which may protrude and extend above the main surface of the silicon substrate, and the source and drain regions are formed at opposite sides of the channel region in the channel length direction. Here, a three-dimensional element body such as the fin or the pillar may be obtained by etching the main surface of the silicon substrate down to a depth of 100 nm or more.

In the etching process of such a three-dimensional element, it is required to minimize the damage to an etched sidewall of a target object. Unlike in the case of a conventional silicon trench etching, the etched sidewall in this process is employed as the channel region of the MOSFET. Accordingly, if the crystal lattice on the sidewall is damaged due to ion incidence, the mobility of electrons or holes (charge carriers) is decreased and the performance of the MOSFET may be significantly deteriorated. The accuracy in a vertical shape of the sidewall of the target object is also required for the stability and the reproducibility of the performance of the MOSFET. Further, it is important that a ratio of etching rate of the silicon substrate to that of the etching mask, i.e., mask selectivity, is sufficiently high to improve the dimensional accuracy in deep etching pattern.

SUMMARY OF THE INVENTION

In view of the above, the present invention provides a Si etching method that can prevent damage of a sidewall and obtain both a high selectivity and a vertically etched sidewall in an etching process of a silicon substrate or a silicon layer.

In accordance with an aspect of the present invention, there is provided a Si etching method including: arranging a silicon substrate or a substrate having a silicon layer in a processing chamber; generating a plasma of an etching gas in the processing chamber; and etching the silicon substrate by the plasma. The etching gas is a gaseous mixture including a $Br_2$ gas and one of a $Cl_2$ gas and a chloride gas. The chloride gas has a mass that is higher than that of the $Cl_2$ gas.

BRIEF DESCRIPTION OF THE DRAWINGS

The objects and features of the present invention will become apparent from the following description of embodiments, given in conjunction with the accompanying drawings, in which:

FIG. 4 is a table where parameters used in test examples A1 to A3, respectively, obtained etching characteristics and SEM pictures are illustrated for the dry etching in accordance with the embodiment of the present invention;

DETAILED DESCRIPTION OF THE EMBODIMENTS

An experiment in accordance with an embodiment of the present invention will now be described with reference to the accompanying drawings which form a part hereof.

Figure 1:
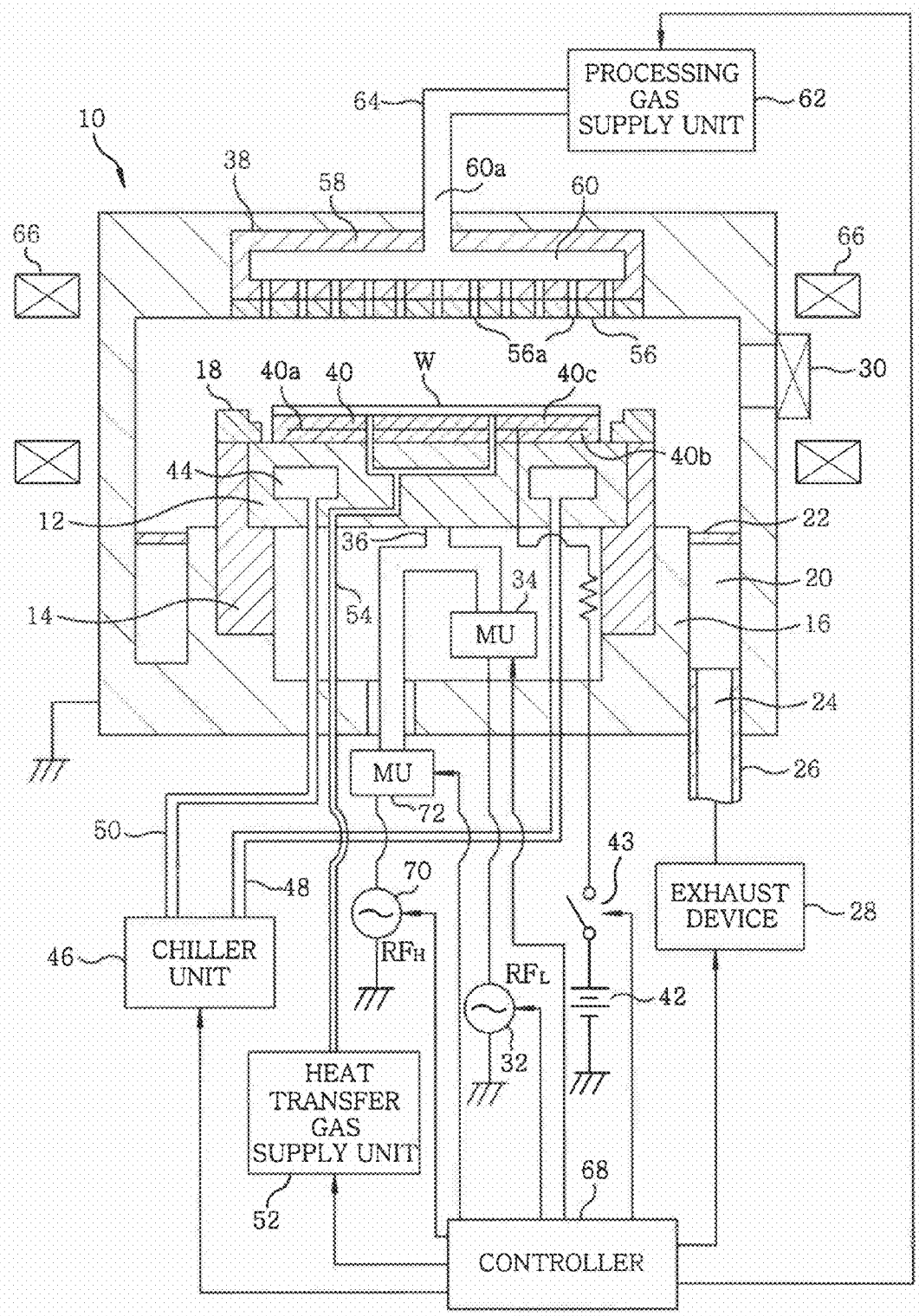
FIG. 1 is a vertical cross sectional view showing the structure of a capacitively coupled plasma etching apparatus for executing a Si etching method in accordance with the present invention.

FIG. 1 shows the structure of a plasma etching apparatus for executing a dry etching method of the present invention. The plasma etching apparatus is of a capacitively coupled parallel plate type where dual RF (high frequency) powers are applied to a lower electrode, and includes a cylindrical chamber (processing chamber) 10 made of a metal, e.g., aluminum, stainless steel or the like. The chamber 10 is frame-grounded.

In the chamber 10, a cylindrical susceptor 12 serving as a lower electrode is placed to mount a target object (target substrate) thereon. The susceptor 12, which is made of, e.g., aluminum, is supported by an insulating tubular support 14, which is in turn supported by a cylindrical support 16 vertically extending from a bottom portion of the chamber 10 upwardly. A focus ring 18 made of, e.g., quartz or silicon is arranged on an upper surface of the tubular support 14 to annularly surround a peripheral part of a top surface of the susceptor 12.

An exhaust path 20 is formed between a sidewall of the chamber 10 and the cylindrical support 16. An annular baffle plate 22 is attached to the entrance or the inside of the exhaust path 20, and an exhaust port 24 is disposed at a bottom portion of the chamber 10. An exhaust device 28 is connected to the exhaust port 24 via an exhaust pipe 26. The exhaust device 28 includes a vacuum pump to evacuate an inner space of the chamber 10 to a predetermined vacuum level. Attached to the sidewall of the chamber 10 is a gate valve 30 for opening and closing a gateway through which a silicon wafer W is loaded or unloaded.

A first high frequency power supply 32 for attracting ions is electrically connected to the susceptor 12 via a first matching unit (MU) 34 and a power feed rod 36. The first high frequency power supply 32 supplies a first high frequency power $RF_L$ to the susceptor 12. The first high frequency power $RF_L$ has a frequency that is equal to or smaller than about 13.56 MHz, adequate to attract ions in the plasma to the silicon wafer W.

A second high frequency power supply 70 for generating a plasma is also electrically connected to the susceptor 12 via a second matching unit (MU) 72 and the power feed rod 36. The second high frequency power supply 70 supplies a second high frequency power $RF_H$ to the susceptor 12. The second high frequency power $RF_H$ has a frequency that is equal to or greater than about 40 MHz, adequate to discharge an etching gas by the high frequency power.

At a ceiling portion of the chamber 10, a shower head 38 is placed as an upper electrode of ground potential. The first and the second high frequency power $RF_L$ and $RF_H$ respectively supplied from the first and second high frequency power supply 32 and 70 are capacitively applied between the susceptor 12 and the shower head 38.

An electrostatic chuck 40 is placed on the top surface of the susceptor 12 to hold the silicon wafer W by an electrostatic force. The electrostatic chuck 40 includes an electrode 40a made of a conductive film and a pair of insulation films 40b and 40c. The electrode 40a is interposed between the insulation films 40b and 40c. A DC power supply 42 is electrically connected to the electrode 40a via a switch 43. By a DC voltage supplied from the DC power supply 42, the silicon wafer W can be attracted to and held by the electrostatic chuck 40 by the Coulomb force.

A coolant chamber 44, which extends in, e.g., a circumferential direction, is installed inside the susceptor 12. A coolant, e.g., a cooling water, of a predetermined temperature is circularly supplied from a chiller unit 46 to the coolant chamber 44 via pipelines 48 and 50. It is possible to control a process temperature of the silicon wafer W held on the electrostatic chuck 40 by adjusting the temperature of the coolant. Moreover, a heat transfer gas, e.g., He gas, is supplied from a heat transfer gas supply unit 52 to a space between a top surface of the electrostatic chuck 40 and a bottom surface of the silicon wafer W through a gas supply line 54.

The shower head 38 placed at the ceiling portion of the chamber 10 includes a lower electrode plate 56 having a plurality of gas injection holes 56a and an electrode support 58 that detachably supports the electrode plate 56. A buffer chamber 60 is provided inside the electrode support 58. A processing gas supply unit 62 is connected to a gas inlet opening 60a of the buffer chamber 60 via a gas supply line 64.

Provided along a circumference of the chamber 10 is a magnet unit 66 extending annularly or concentrically around the chamber 10. In the chamber 10, a high density plasma is generated near the surface of the susceptor 12 by the collective action of an RF electric field, which is produced between the shower head 38 and the susceptor 12 by the second high frequency power $RF_H$, and a magnetic field generated by the magnet unit 66. In this embodiment, even though a plasma generation space inside the chamber 10, especially the plasma generation space between the shower head 38 and the susceptor 12 has a low pressure of about 1 mTorr (about 0.133 Pa), it is possible to obtain a high density plasma having electron density of about $1 \times 10^{10}/cm^3$ or more in order to execute the dry etching method of the present invention.

A controller 68 controls operations of various parts of the plasma etching apparatus, e.g., the exhaust device 28, the first high frequency power supply 32, the first matching unit 34, the switch 43, the chiller unit 46, the heat transfer gas supply unit 52, the processing gas supply unit 62, the second high frequency power supply 70, the second matching unit 72, and the like. The controller 68 is connected to a host computer (not shown) and the like.

Figure 2:
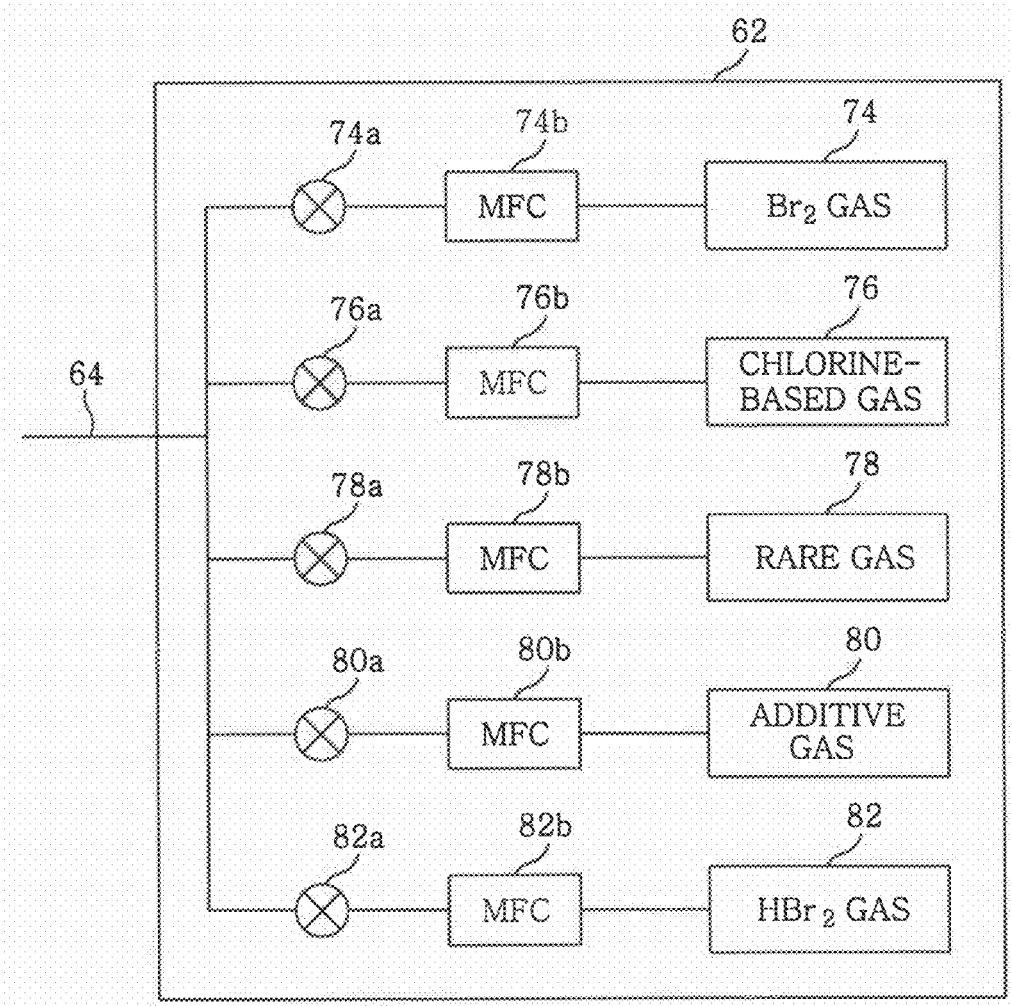
FIG. 2 is a block diagram showing an example of a processing gas supply unit.

As shown in FIG. 2, the processing gas supply unit 62 includes a $Br_2$ gas source 74 for supplying $Br_2$ (bromine) gas, a chlorine based gas source 76 for supplying $Cl_2$ (chlorine) or chloride gas, a rare gas source 78 for supplying a rare gas such as He (helium) or Ar (argon) gas, an additive gas source 80 for supplying a desired added gas, opening valves 74a, 76a, 78a, and 80a used to control the combinations of mixed gases, and mass flow controllers (MFC) 74b, 76b, 78b, and 80b for individually controlling the flow rates of mixed gases.

The processing gas supply unit 62 further includes a HBr gas source 82, an opening valve 82a, and an MFC 82b, which are used for the following experiment. The $Cl_2$ gas supplied from the chlorine based gas source 76 is also used for the experiment. The $Cl_2$ gas is not used in the Si etching in accordance with the embodiment of the present invention.

In the plasma etching apparatus, the gate valve 30 is opened first, and a target object, i.e., the silicon wafer W, is loaded in the chamber 10 and mounted on the electrostatic chuck 40 to perform the dry etching. Then, the etching gas is supplied from the processing gas supply unit 62 to the chamber 10 at a predetermined flow rate and mixing (flow rate) ratio, and the pressure inside the chamber 10 is adjusted by the exhaust device 28 at a preset level. Moreover, the first high frequency power $RF_L$ having a preset level is supplied from the first high frequency power supply 32 to the susceptor 12 and the second high frequency power $RF_H$ having a preset level is supplied from the second high frequency power supply 70 to the susceptor 12.

A DC voltage is supplied from the DC power supply 42 to the electrode 40a of the electrostatic chuck 40 so that the silicon wafer W is firmly mounted on the electrostatic chuck 40. The etching gas injected from the shower head 38 is glow-discharged between the electrodes 12 and 38 to thereby be converted into a plasma. Radicals or ions generated in the plasma pass through openings in an etching mask on the surface of the silicon wafer W and react with the target object (e.g., the silicon substrate), thereby etching the target object in a desired pattern.

In such a dry etching process, the high frequency power $RF_H$ having a relatively high frequency (e.g., about 40 MHz or more, and preferably about 80 MHz to 300 MHz) supplied from the second high frequency power supply 70 to the susceptor (lower electrode) 12 mainly contributes to the discharge of the etching gas or the generation of the plasma; and the first high frequency power $RF_L$ having a relatively low frequency (e.g., about 2 MHz to 13.56 MHz) supplied from the first high frequency power supply 32 to the susceptor (lower electrode) 12 mainly contributes to ion attraction from the plasma to the silicon wafer W.

During the dry etching, that is, while the plasma is generated in the processing space, a lower ion sheath is formed between the bulk plasma and the susceptor (lower electrode) 12. As a result, a negative self-bias voltage $V_{dc}$, having the substantially same magnitude as a voltage drop of the lower ion sheath, is produced at the susceptor 12 and the silicon wafer W. An absolute value $|V_{dc}|$ of the self-bias voltage is in proportion to a peak-to-peak value $V_{pp}$ of the voltage of the first high frequency power $RF_L$ supplied to the susceptor 12.

In this embodiment, the dry etching, i.e., the Si etching is carried out on a target object, i.e., a substrate (silicon substrate) of a silicon wafer W or a silicon layer of a silicon wafer in the plasma etching apparatus (FIG. 1) by introducing a gaseous mixture as an etching gas from the processing gas supply unit 62 to the chamber 10. The gaseous mixture may be any one of gaseous mixtures of, for example, the $Br_2$ and the $Cl_2$ gas, the $Br_2$ and the $BCl_3$ gas, the $Br_2$ and the $PCl_3$ gas, and the $Br_2$ and the $AsCl_3$ gas.

Such gaseous mixtures are dissociated and ionized by the high frequency discharge to generate bromine based ions and radicals and chlorine based ions and radicals. The radicals make isotropic reaction with the silicon and the ions are attracted to the silicon wafer W by ion energy according to the self-bias voltage $V_{dc}$, thereby reacting with the silicon mainly in a vertical direction. Here, since the bromine based reaction product has relatively low volatility and the chlorine based reaction product has relatively high volatility, it is possible to obtain an intermediate shape (i.e., the vertical shape) between the taper and bowing shape by controlling their balance.

Moreover, since the hydrogen is not included in the gaseous mixture, there is no hydrogen ion in the plasma and the etched sidewall of the target object is not damaged by the incidence and impact of the hydrogen ion. Further, it is possible to obtain a high selectivity, especially, a sufficiently high selectivity against an inorganic mask including silicon by mixing the bromine based gas and the chlorine based gas.

In the embodiment of the present invention, in the case of employing, as the chlorine based gas, a polymer chloride gas such as the $BCl_3$ gas, the $PCl_3$ gas, or the $AsCl_3$ gas, dominantly many chlorine based ions having high mass are generated by the dissociation and ionization of gas molecules. Even though the chlorine based ions of high mass accelerated in the ion sheath layer collide with other ions and radicals, the chlorine based ions are not scattered or their scattering angles are small even though the chlorine based ions are scattered. Accordingly, the chlorine based ions are substantially vertically incident on the substrate, thereby performing a stable anisotropic etching.

As an example of the etching process to which the present invention can be adequately applied, a Si etching method for forming a pillar-shaped element body for a vertical transistor on a main surface of the silicon wafer W in accordance to the embodiment of the present invention will be described below with reference to FIGS. 3A to 11.

Figure 3A:
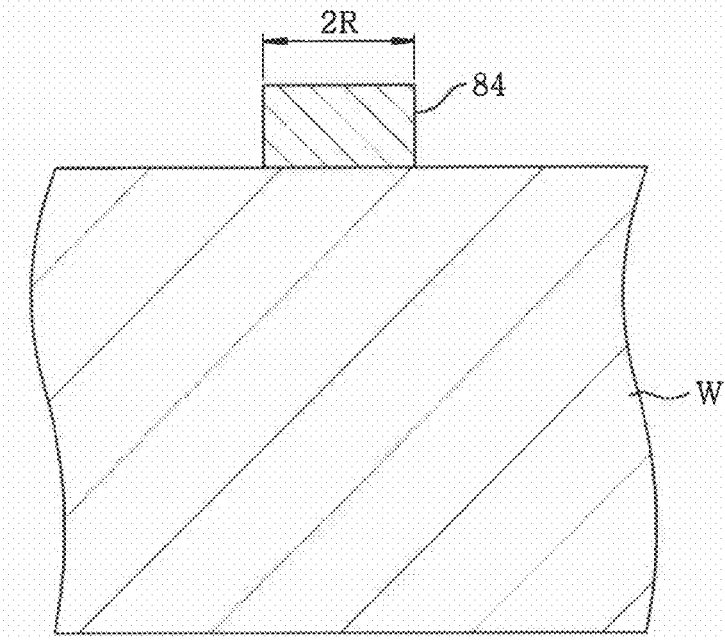
FIG. 3A is a vertical cross sectional view showing one process of an etching of forming a cylindrical pillar-shaped element body by using the Si etching method in accordance with an embodiment of the present invention.
Figure 3B:
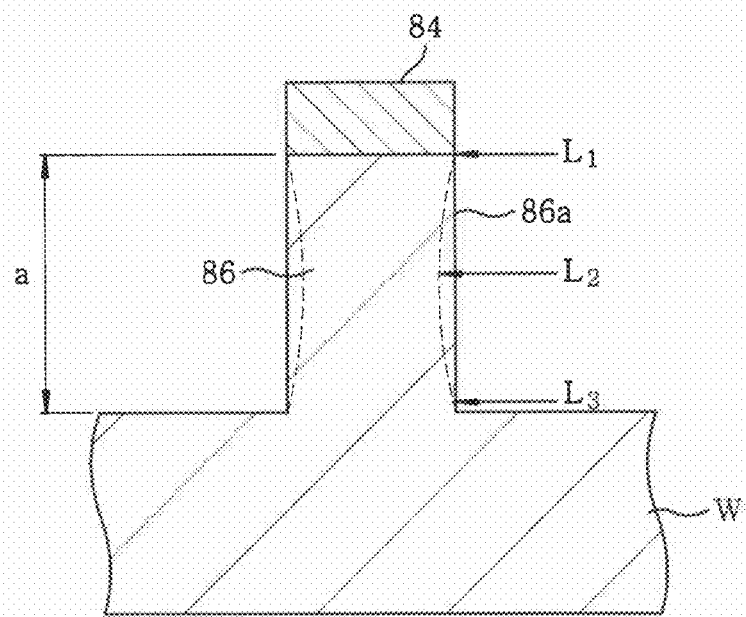
FIG. 3B is a vertical cross sectional view showing a basic shape of the cylindrical pillar-shaped element body produced by the Si etching method in accordance with the embodiment of the present invention.

In order to form such kind of pillar-shaped element body, a mask material (preferably, an inorganic film containing silicon) applied on a silicon wafer is patterned into a circular plate 84 having a diameter of 2R as shown in FIG. 3A. Then, the silicon wafer W is etched down to a desired depth a by using the circular plate 84 as an etching mask. Accordingly, as shown in FIG. 3B, a cylindrical pillar-shaped element body 86 having desirable dimensions, e.g., the diameter 2R of about 200 nm and the depth a of about 200 nm, is formed on a main surface of the silicon wafer W.

(Experiment)

In an experiment, an etching experiment of forming the pillar-shaped element body 86 on the silicon wafer W was performed by executing the dry etching of the silicon wafer W under various conditions by using the capacitively coupled plasma etching apparatus shown in FIG. 1 and a gaseous mixture including a $Cl_2$ and a HBr gas as an etching gas. The experiment was carried out by changing a mixing ratio of the $Cl_2$ and the HBr gas as a main parameter. Main conditions are as follows.

Diameter of silicon wafer: 300 mm

Etching mask: SiN (150 nm)

Etching gas: $Cl_2$ gas/HBr gas

Flow rates: $Cl_2$ gas=0, 50, and 100 sccm, HBr gas=0, 50, and 100 sccm

Pressure: 20 mTorr

First high frequency power: 13 MHz, and bias RF power of 400 W

Second high frequency power: 100 MHz, and RF power of 600 W

Distance between upper and lower electrodes: 30 mm

Temperature: upper electrode/sidewall of chamber/lower electrode=80/60/65° C.

FIG. 4 is a table where parameters used in test examples 1 to 3, respectively, obtained etching characteristics and SEM pictures are illustrated. All data in the test examples 1 to 3 is obtained from a pattern sparse portion.

Test Example 1

The flow rates of $Cl_2$ gas and HBr gas were 100 sccm and sccm, respectively, that is, a single gas of $Cl_2$ was employed as the etching gas. The mask selectivity of 4.0 and the bowing $\Delta CD$ of 14 nm were obtained.

In the SEM pictures shown in FIG. 4, in the case of, e.g., the test example 1, the following results were obtained. A diameter $L_1$ at the top of the pillar was 187 nm, a diameter $L_2$ at the middle of the pillar was 173 nm, a diameter $L_3$ at the bottom of the pillar was 208 nm, and a height a of the pillar was 230 nm.

Test Example 2

The flow rates of $Cl_2$ gas and HBr gas were 50 sccm and 50 sccm, respectively. The mask selectivity of 3.6 and the bowing ΔCD of 4 nm were obtained.

Test Example 3

The flow rates of $Cl_2$ gas and HBr gas were 0 sccm and 100 sccm, respectively, that is, a single gas of HBr was employed as the etching gas. The mask selectivity of 3.1 and the obvious taper shape were obtained.

As shown in FIG. 3B, the bowing ΔCD is a factor for evaluating the vertical shape of the etched sidewall of the pillar 86 and is the difference ($L_1-L_2$) obtained by subtracting the diameter $L_2$ at the middle of the pillar 86 from the diameter $L_1$ at the top of the pillar 86. If the bowing ΔCD is a positive value, the pillar 86 has a bowing shape. In contrast, if the bowing ΔCD is a negative value, the pillar 86 has a taper shape. As an absolute value of the bowing ΔCD gets smaller, the sidewall of the pillar 86 is more vertically etched. As in the test example 1, if the bowing ΔCD is beyond 10 nm, a sidewall 86a of the pillar 86 obviously shows the bowing shape. As in the test sample 2, if the bowing ΔCD is about 4 nm, it can be said that the sidewall 86a of the pillar 86 is substantially vertically etched.

As a result, when the single gas of $Cl_2$ was employed as the etching gas (test example 1), the sidewall 86a of the pillar 86 had the bowing shape. In contrast, when the single gas of HBr was employed as the etching gas (test example 3), the sidewall 86a of the pillar 86 had the taper shape. However, when the gaseous mixture including the $Cl_2$ and the HBr gas (the mixing ratio is 1:1) was employed as the etching gas (test example 2), the sidewall 86a of the pillar 86 was substantially vertically etched.

In other words, both the bromine based gas and the chlorine based gas are halogen gases and their ions and radicals sufficiently react with silicon. The chlorine based gas produces a reaction product having relatively high volatility, while the bromine based gas produces a reaction product having relatively low volatility. Accordingly, the sidewall 86a is etched in the bowing or the taper shape. However, it was seen from the test examples 1 to 3 that it is possible to substantially vertically etch the sidewall 86a by adequately controlling the balance between the bromine based gas and the chloride based gas to obtain an intermediate shape between the taper and bowing shape.

Further, in the test example 2 where the gaseous mixture including the $Cl_2$ and the HBr gas was employed as the etching gas, it was possible to obtain the sufficiently high mask selectivity of 3.6, although it is slightly lower than the mask selectivity of 4.0 in the test example 1 where the single gas of $Cl_2$ was employed as the etching gas. Accordingly, it can be said that the gaseous mixture including the $Cl_2$ and the HBr gas is the etching gas which satisfies both of the two requirements, i.e., the high vertical processability and the high mask selectivity.

However, there occurs the following problem when the gaseous mixture including the $Cl_2$ and the HBr gas is employed to carry out the etching process of the three-dimensional element body (pillar) 86 for a vertical transistor. When the gas molecules of HBr are dissociated and ionized to be discharged or to be converted to plasma, many $H^+$ ions are generated and the $H^+$ ions accelerated in the ion sheath layer are scattered by colliding with other ions and radicals. Accordingly, the $H^+$ ions are inclinedly incident on the sidewall of a target object to infiltrate the sidewall to a deep portion thereof. In other words, when the $H^+$ ions are deeply infiltrates the inside of the sidewall 86a of the pillar 86, the crystal lattices of the area employed as the channel region of an insulated gate field effect transistor, e.g., a MOSFET are damaged thereby. Therefore, the performance of the MOSFET is deteriorated.

Figure 5:
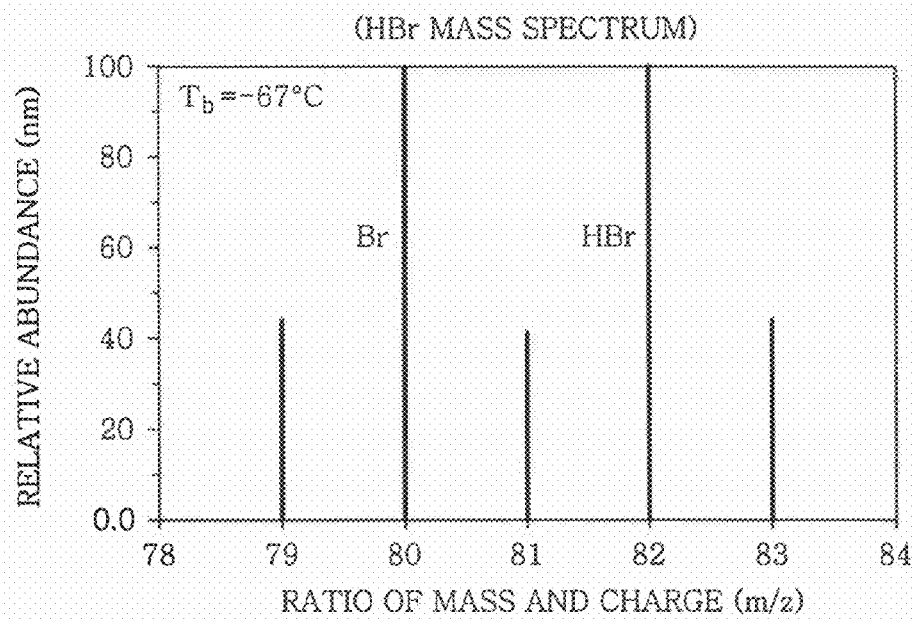
FIG. 5 shows mass spectrums of HBr gas.

FIG. 5 shows mass spectrums of the HBr gas. Such kinds of mass spectrums indicate kinds and relative abundances of molecules and/or atoms generated when a sample gas (HBr gas) is dissociated and ionized. Instead of actually discharging the sample gas (HBr gas) in the plasma etching apparatus, by using a mass spectrometer, the mass spectrum or the fragment composition for the intensity ratio of ions of molecules and/or atoms obtained when the sample gas (HBr gas) was made to collide with electrons is measured.

The HBr gas collided with electrons to be dissociated and ionized into Br and $H^+$ ions. From the mass spectrums shown in FIG. 5, it can be seen that the $H^+$ ions exist in the substantially same abundance as those of Br and HBr ions (appropriately 1:1:1), i.e., many $H^+$ ions are generated. In FIG. 5, the fragments near mass 79 and 81 are isomers and $T_b$ is a boiling point.

Figure 6:
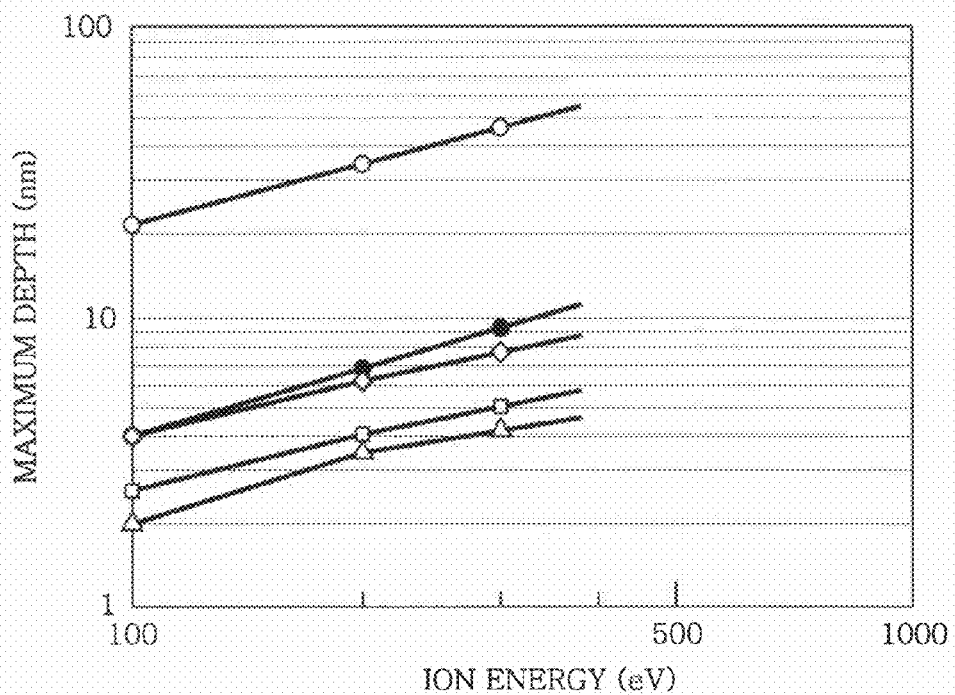
FIG. 6 is a graph showing the relationship between ion energy and ion impact depth according to various kinds of ions when the ions are vertically incident on a silicon substrate.

FIG. 6 is a graph showing the relationship between ion energy and ion infiltrating depth according to various kinds of ions when the ions are incident on a silicon substrate vertically (i.e., incident angle is 0). As shown in FIG. 6, it is highly likely that the $H^+$ ion more deeply infiltrates the inside of the silicon substrate than other ions ($O^+$, $F^+$, $Cl^+$, $Br^+$). For example, when the incident ion energy is 100 eV, the $O^+$, $F^+$, $Cl^+$, and $Br^+$ ions infiltrate the inside of the silicon substrate to the depths of about 4 nm, 4 nm, 2.5 nm, and 2 nm, respectively, while the $H^+$ ion infiltrates the inside of the silicon substrate to the depth of about 20 nm. Even when the incident ion energy is increased to 300 eV, none of the $O^+$, $F^+$, $Cl^+$, and $Br^+$ ions infiltrate the inside of the silicon substrate to the depth exceeding about 10 nm, while the $H^+$ ion infiltrates the inside of the silicon substrate to the depth of about 50 nm or more. The ion infiltrating depth of the $H^+$ ion is dominant.

In order to prevent the damage caused by the infiltration of $H^+$ ion, the sidewall of a target object (the sidewall 86a of the pillar 86) may be oxidized to the maximum ion infiltrating depth and then the damaged portion of the sidewall may be removed by an oxide film etching. In this case, however, the diameter of the pillar 86 is undesirably or excessively reduced.

In accordance with the embodiment of the present invention, the $Br_2$ gas is employed instead of the HBr gas. Since the $Br_2$ gas includes no hydrogen, even though the $Br_2$ gas is ionized, the $H^+$ ion is not generated. Accordingly, it is not necessary to consider the damage caused by the $H^+$ ion incidence on the sidewall of a target object (the sidewall 86a of the pillar 86). Moreover, $Br_2$ gas molecules themselves are reactive molecules and the silicon is adequately etched by $Br^+$ ions or Br radicals generated by the dissociation and ionization of the $Br_2$ gas molecules. In other words, in the Si etching, the $Br_2$ gas sufficiently fulfills the functions of the bromine based gas, especially, the function of producing a reaction product having relatively low volatility.

Figure 7:
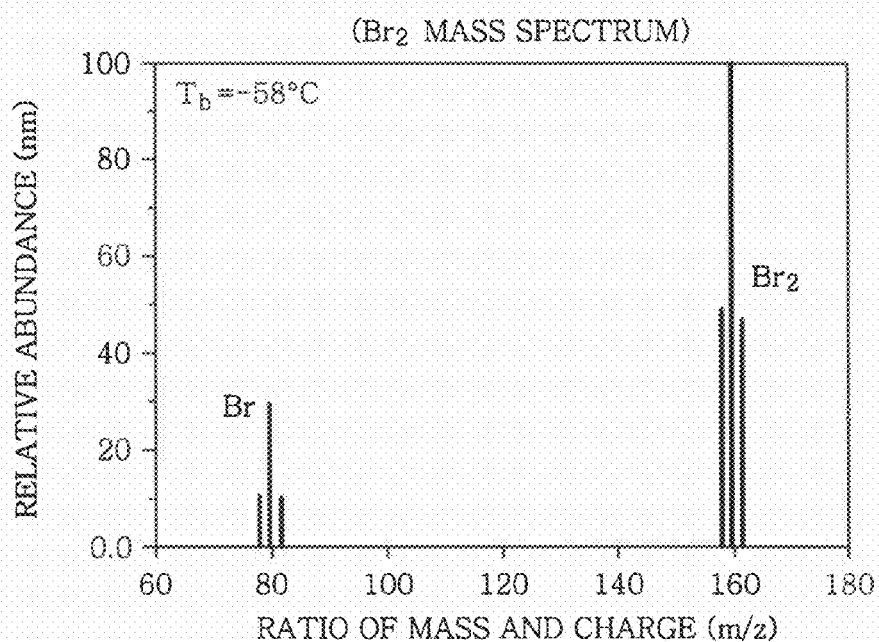
FIG. 7 shows mass spectrums of $Br_2$ gas.

FIG. 7 shows mass spectrums of the $Br_2$ gas. From the mass spectrums, it can be seen that the abundance of the $Br_2$ and Br is approximately 1:0.3. Even though colliding with electrons, the $Br_2$ molecules are difficult to be decomposed and it is difficult to occur the mass vibration. Of course, no $H^+$ ion is generated from the $Br_2$ molecules.

Accordingly, a gaseous mixture including the $Cl_2$ and the $Br_2$ gas is suggested as a preferable etching gas in the Si etching for forming a three-dimensional element body (pillar 86) for a vertical transistor in accordance with the embodiment of the present invention.

Further, an alternative gas for the is $Cl_2$ gas suggested in accordance with the embodiment of the present invention. This is because even though the $Cl_2$ gas very actively reacts with silicon and is preferable to increase the etching rate, it is highly likely that the sidewall etched by the $Cl_2$ gas has a bowing shape. One of the reasons that the sidewall etched by the $Cl_2$ gas has the bowing shape is the isotropic radical etching. However, it is the main factor for the bowing shape that the $Cl^+$ ions are inclinedly incident on the sidewall by being scattered. Specifically, the $Cl^+$ ions accelerated in the ion sheath layer are attracted toward the silicon wafer W vertically. However, although the $Cl^+$ ions are not scattered as much as the $H^+$ ions, the $Cl^+$ ions are easily scattered by colliding with other ions or radicals, thereby being incident on the sidewall of a target object (the sidewall 86a of the pillar 86) inclinedly. Accordingly, the sidewall is etched to have the bowing shape.

Figure 8:
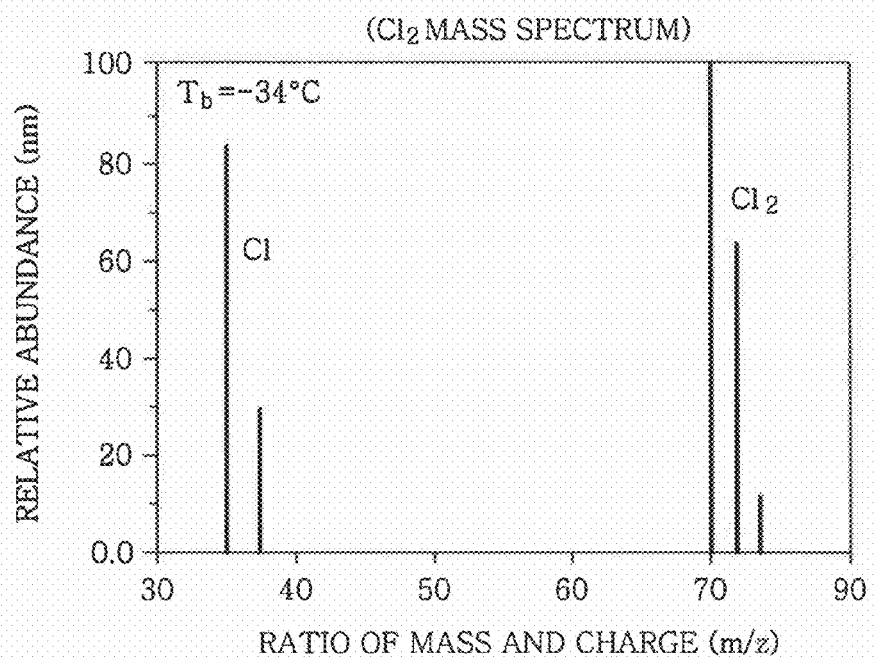
FIG. 8 shows mass spectrums of $Cl_2$ gas.

FIG. 8 shows mass spectrums of the $Cl_2$ gas. From the mass spectrums, it can be seen that the $Cl_2$ molecules are easily dissociated and ionized by colliding with electrons. Accordingly, at an abundance of the $Cl_2$ and Cl of approximately 1:0.8, many $Cl^+$ ions of low mass are generated. Due to the low mass, the $Cl^+$ ions are easily scattered.

For that reason, instead of the $Cl_2$ gas, the chloride gas of higher mass than the $Cl_2$ gas is employed in the embodiment of the present invention. A polymer inorganic chloride gas such as $BCl_3$ (Boron trichloride) gas, $PCl_3$ (Phosphorus trichloride) gas, $AsCl_3$ (Arsenic trichloride) gas or the like is preferably employed in accordance with the embodiment of the present invention.

Figure 9:
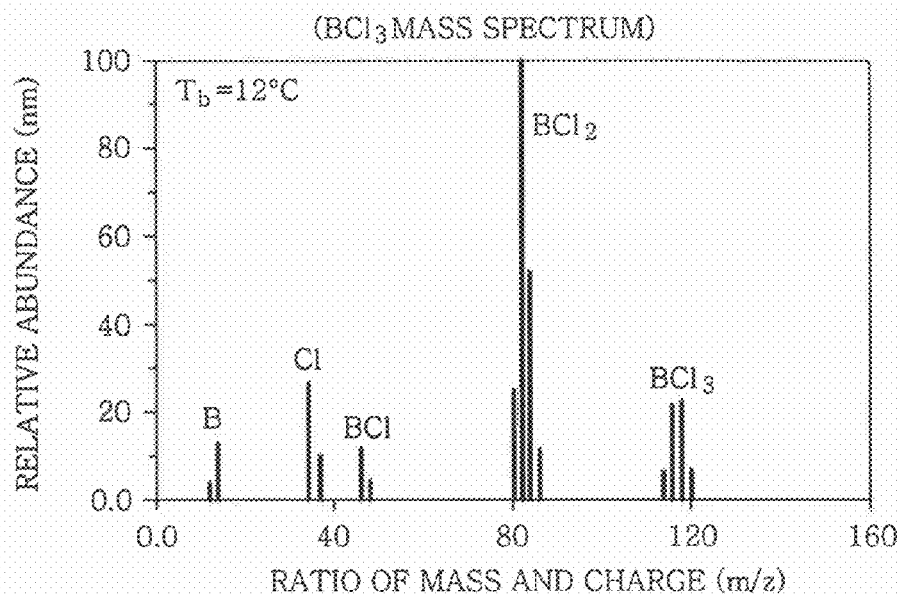
FIG. 9 shows mass spectrums of $BCl_3$ gas.
Figure 10:
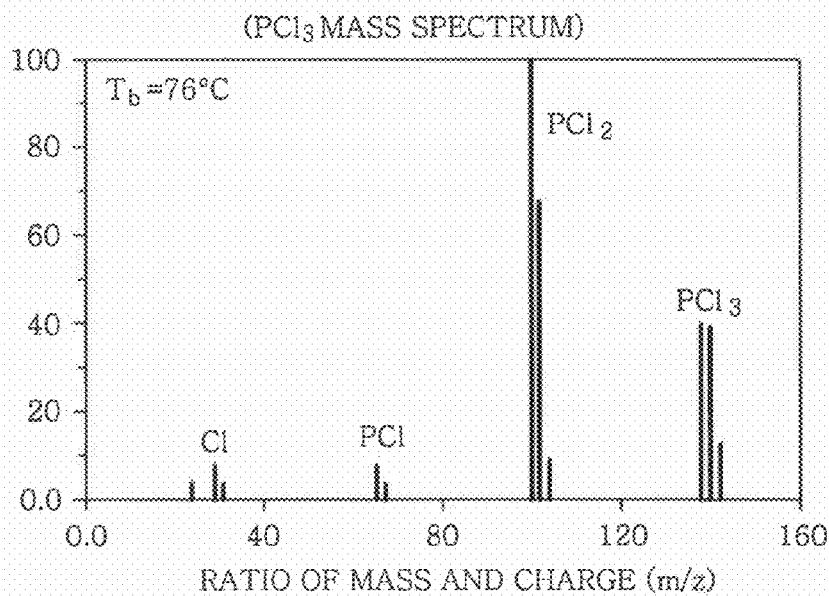
FIG. 10 shows mass spectrums of $PCl_3$ gas.
Figure 11:
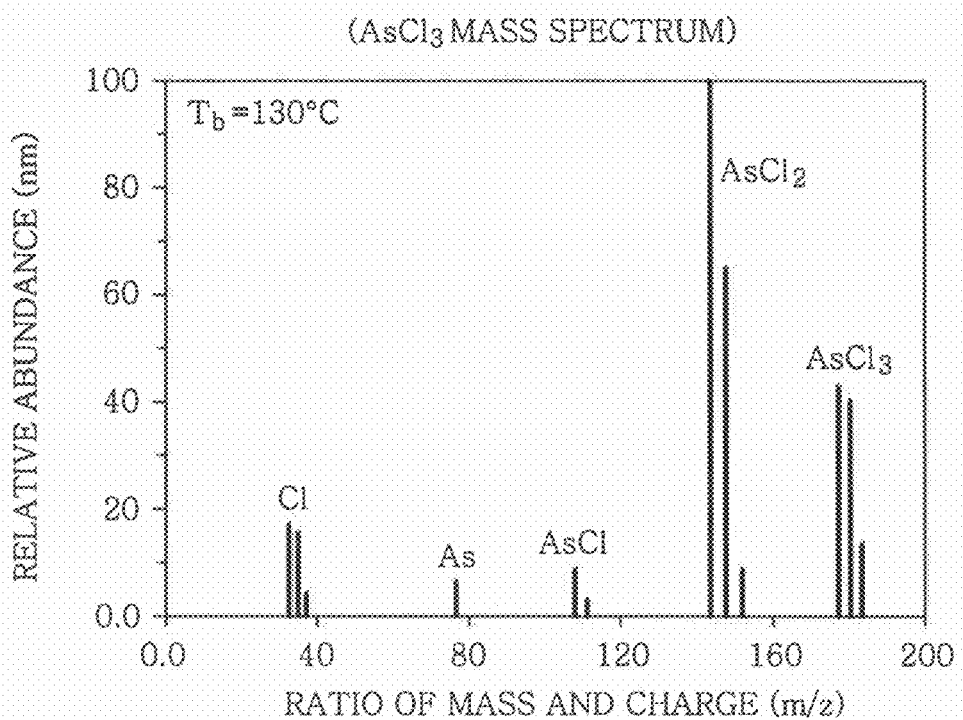
FIG. 11 shows mass spectrums of $AsCl_3$ gas.

FIGS. 9 to 11 show mass spectrums of the $BCl_3$ gas, the $PCl_3$, gas and the $AsCl_3$ gas, respectively.

As shown in the mass spectrums of the $BCl_3$ gas in FIG. 9, the amount of $BCl_2$ ions is greatest and the relative abundances of $BCl_3$, BCl, and Cl ions to the $BCl_2$ ions are about 0.2, 0.15, and 0.3 respectively. In other words, among the ions generated by dissociating and ionizing the $BCl_3$ gas molecules, there are dominantly many high polymer ions, i.e., $BCl_2$ ions having the mass of about 82 and $BCl_3$ ions having the mass of about 117. Since fragments of the high polymer ions have high mass, when colliding with other ions and radicals, such the fragments are rarely scattered or the scattering angles are very small, thereby being incident on the silicon wafer vertically or straightly. Accordingly, a few ions are incident on the sidewall of a target object (the sidewall 86a of the pillar 86).

As shown in the mass spectrums of the $PCl_3$ gas in FIG. 10, the amount of $PCl_2$ ions having the mass of about 102 is greatest and the amount of $PCl_3$ ions having the mass of about 137 is next to thereto. In other words, relatively many polymer ions such as $PCl_2$ and $PCl_3$ ions are generated by the dissociation and ionization of the $PCl_3$ gas molecules. Since fragments of the high polymer ions also have high mass, when colliding with other ions and radicals, it is difficult for such the fragments to be scattered, thereby being incident on the silicon wafer vertically or straightly. Accordingly, a few ions are incident on the sidewall and the anisotropic etching is stably carried out.

Similarly, as shown in the mass spectrums of the $AsCl_3$ gas in FIG. 11, dominantly many $AsCl_2$ ions having the mass of about 146 and $AsCl_3$ ions having the mass of about 181 were generated by the dissociation and ionization of the $AsCl_3$ gas molecules. As in the case of the $BCl_3$ or the $PCl_3$ gas, by the fragments of the ions having the high mass, the Si etching can be stably carried out with the highly vertical processability.

As such, in accordance with the embodiment of the present invention, it is possible to improve the vertical processability of the Si etching by making smaller the scattering angles of the chlorine based ions incident on the silicon wafer W by employing one of the $BCl_3$, $PCl_3$, and $AsCl_3$ gases having higher mass than that of the $Cl_2$ gas as the chlorine based included in the etching gas.

The present invention is adequately applicable to a Si etching for forming a pillar-shaped element body for a vertical transistor in accordance with the embodiment. However, the present invention is also applicable to a typical Si trench etching and further to an etching of a silicon layer for forming a gate electrode of plate-type metal insulator semiconductor field effect transistor (MISFET).

In accordance with a Si etching method of the present invention, it is possible to prevent damage of a sidewall and obtain both the high selectivity and a highly vertically etched sidewall in an etching process of a silicon substrate or a silicon layer with the above configurations and functions.

While the invention has been shown and described with respect to the embodiments, it will be understood by those skilled in the art that various changes and modification may be made without departing from the scope of the invention as defined in the following claims.

For example, a $SiCl_4$ (silicon tetrachloride) or an $AsCl_5$ (Arsenic pentachloride) gas can be employed as a chloride gas included in the etching gas in accordance with the embodiment of the present invention.

To improve the controllability of the vertical processability, it is possible to add $O_2$ or $N_2$ gas, or a fluorine compound gas, e.g., $CF_4$, $SF_6$, or $NF_3$ gas. Alternatively, it is possible to add a rare gas such as Ar or He gas.

In accordance with a Si etching method of the present invention, SiN can be adequately employed as a mask material. Alternatively, other silicon based inorganic materials such as $SiO_2$, SiOC, and the like, or a resist can be employed.

The plasma etching apparatus usable for the Si etching method of the present invention is not limited to the aforementioned embodiment, but various modifications are possible. For example, it is possible to use an upper-and-lower plate dual frequency application type plasma etching apparatus, which a high frequency power $RF_H$ for plasma generation is applied to an upper electrode and a high frequency power $RF_L$ for ion attraction is applied to a lower electrode. In addition to a capacitively coupled plasma etching apparatus, it is possible to use, e.g., a microwave plasma etching apparatus, which generates a plasma by using a microwave power, and an inductively coupled plasma etching apparatus, which has an antenna arranged on an upper surface of a chamber or around the chamber and generates a plasma by an induced electromagnetic field.

What is claimed is:

1. A Si etching method comprising:
    arranging a silicon substrate or a substrate having a silicon layer in a processing chamber;
    generating a plasma of an etching gas in the processing chamber; and
    etching the silicon substrate by the plasma,
    wherein the etching gas is a gaseous mixture including a $Br_2$ gas and an $AsCl_3$ gas, the gaseous mixture not having hydrogen.

2. The method of claim 1, wherein the etching gas further includes a rare gas.

3. The method of claim 1, wherein the etching gas further includes an $O_2$ gas or a $N_2$ gas.

4. The method of claim 1, wherein the etching gas further includes a fluorine compound gas.

5. The method of claim 4, wherein the fluorine compound gas is one of a $CF_4$ gas, a $SF_6$ gas, and a $NF_3$ gas.

6. The method of claim 1, wherein the silicon substrate is mounted on an electrode arranged in the processing chamber, and
   a radio frequency power for attracting ions from the plasma is supplied to the electrode.

7. The method of claim 6, wherein an additional electrode is disposed in the processing chamber in parallel with the electrode with a gap therebetween and an additional radio frequency power for discharging the etching gas is supplied to the electrode or the additional electrode.

8. The method of claim 1, wherein a three-dimensional element body having a columnar or a rectangular parallelepiped shape is formed on a main surface of the silicon substrate by etching the silicon substrate.

9. The method of claim 1, wherein the silicon layer of the substrate is etched to form a gate electrode of an insulated gate field effect transistor.

10. The method of claim 1, wherein an etching mask for the etching includes an inorganic layer containing silicon.

\* \* \* \* \*